United States Patent
Chen et al.

(10) Patent No.: US 9,269,612 B2
(45) Date of Patent: Feb. 23, 2016

(54) MECHANISMS OF FORMING DAMASCENE INTERCONNECT STRUCTURES

(75) Inventors: Chien-An Chen, Zhubei (TW);
Wen-Jiun Liu, Zhunan Township (TW);
Chun-Chieh Lin, Taichung (TW);
Hung-Wen Su, Jhubei (TW);
Ming-Hsing Tsai, Chu-Pei (TW);
Syun-Ming Jang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/434,691

(22) Filed: Mar. 29, 2012

(65) Prior Publication Data
US 2013/0127055 A1 May 23, 2013

Related U.S. Application Data

(60) Provisional application No. 61/562,705, filed on Nov. 22, 2011.

(51) Int. Cl.
*H01L 21/768* (2006.01)
*H01L 23/532* (2006.01)

(52) U.S. Cl.
CPC .... *H01L 21/76819* (2013.01); *H01L 21/76834* (2013.01); *H01L 21/76847* (2013.01); *H01L 21/76849* (2013.01); *H01L 21/76864* (2013.01); *H01L 21/76882* (2013.01); *H01L 23/53238* (2013.01); *H01L 2924/0002* (2013.01)

(58) Field of Classification Search
CPC ............ H01L 23/53238; H01L 21/76843; H01L 21/76849; H01L 21/7685; H01L 21/76852; H01L 23/5283

USPC .......... 257/751, 752, 758, 762; 438/622, 626, 438/627, 631, 643, 645, 653, 687, 927
See application file for complete search history.

(56) References Cited

U.S. PATENT DOCUMENTS

| | | | | |
|---|---|---|---|---|
| 4,876,223 A | * | 10/1989 | Yoda | H01L 21/31133 148/DIG. 51 |
| 6,537,913 B2 | * | 3/2003 | Modak | H01L 21/76846 257/E21.585 |
| 6,596,631 B1 | * | 7/2003 | Ngo | H01L 21/76834 257/E21.576 |
| 6,953,745 B2 | * | 10/2005 | Ahn et al. | 438/637 |

(Continued)

FOREIGN PATENT DOCUMENTS

| KR | 1020020048530 | 6/2002 |
|---|---|---|
| KR | 1020040060447 | 7/2004 |
| KR | 10-2005-0015190 | 2/2005 |

OTHER PUBLICATIONS

Office Action dated Sep. 17, 2013 and English translation from corresponding application No. KR 10-2012-0090542.

(Continued)

*Primary Examiner* — Fernando L Toledo
*Assistant Examiner* — Christine L Hagan
(74) *Attorney, Agent, or Firm* — Hauptman Ham, LLP

(57) ABSTRACT

An interconnect structure includes a first trench and a second trench. The second trench is wider than the first trench. Both trenches are lined with a diffusion barrier layer, and a first conductive layer is deposited over the diffusion barrier layer. A metal cap layer is deposited over the first conductive layer. A second conductive layer is deposited over the metal cap layer in the second trench.

20 Claims, 7 Drawing Sheets

(56) References Cited

U.S. PATENT DOCUMENTS

| | | | |
|---|---|---|---|
| 7,056,787 B2* | 6/2006 | Chang | H01L 21/76802 257/E21.009 |
| 7,193,323 B2* | 3/2007 | Cabral | C25D 9/08 257/751 |
| 2003/0003711 A1* | 1/2003 | Modak | 438/629 |
| 2004/0012090 A1* | 1/2004 | Basol | H01L 21/2885 257/755 |
| 2004/0131878 A1* | 7/2004 | Seet | C23C 14/165 428/641 |
| 2004/0135261 A1 | 7/2004 | Lee et al. | |
| 2005/0029010 A1 | 2/2005 | Ahn et al. | |
| 2005/0104216 A1* | 5/2005 | Cabral | C25D 9/08 257/758 |
| 2005/0164495 A1* | 7/2005 | Chou | C25D 3/38 438/638 |
| 2005/0272258 A1* | 12/2005 | Morita | H01L 21/2855 438/660 |
| 2006/0091551 A1* | 5/2006 | Lin | C25D 3/58 257/762 |
| 2007/0059925 A1* | 3/2007 | Choi et al. | 438/640 |
| 2008/0265416 A1* | 10/2008 | Lee et al. | 257/751 |
| 2009/0186477 A1* | 7/2009 | Shin et al. | 438/618 |

OTHER PUBLICATIONS

Notice of Allowance dated May 19, 2014 and English translation from corresponding application No. KR 10-2012-0090542.

* cited by examiner

MECHANISMS OF FORMING DAMASCENE INTERCONNECT STRUCTURES

CROSS-REFERENCE TO RELATED APPLICATIONS

The present application claims priority of U.S. Provisional Patent Application No. 61/562,705, filed on Nov. 22, 2011, which is incorporated herein by reference in its entirety.

TECHNICAL FIELD

This invention relates generally to metallization of an integrated circuit (IC) device, and more specifically to the formation methods of interconnect structures.

BACKGROUND

Semiconductor devices use an interconnect structure, which includes metal lines and contacts/vias, to provide connection between active devices and/or passive devices with external contacts. Typically, the metal patterns of different metallization layers are electrically interconnected by vias. Semiconductor devices with interconnect circuits, according to current technology, may comprise eight or more levels of metallization to satisfy device connection and geometry requirements. There are challenges in forming interconnect for advanced device technologies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
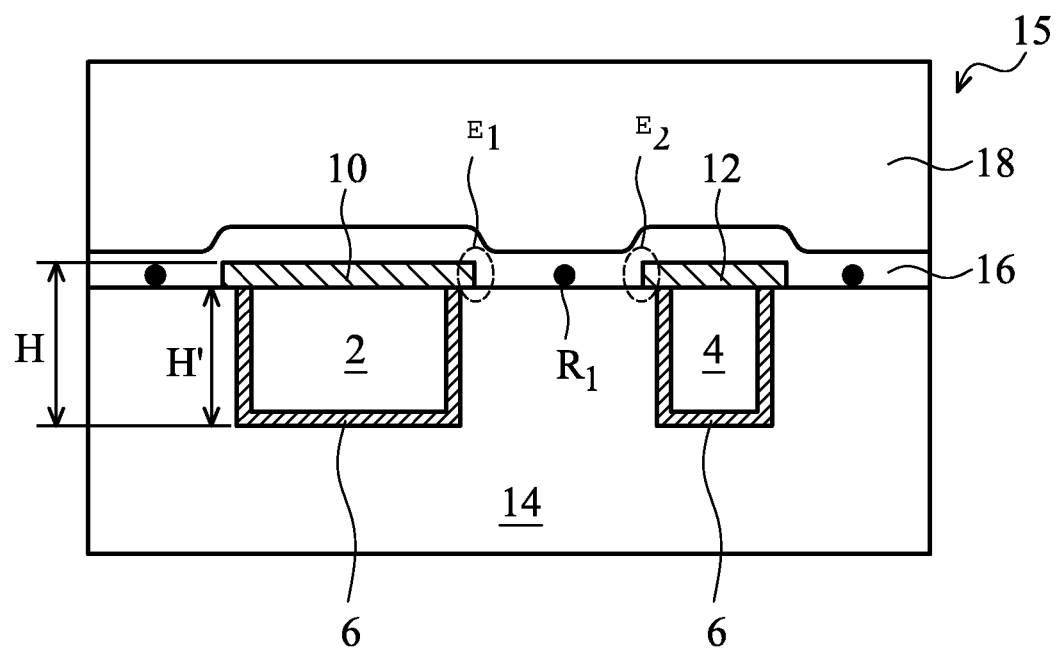
FIG. 1 is a cross-sectional view of an interconnect structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

A common method for forming metal lines is known as "damascene." Generally, this process involves forming an opening in the dielectric interlayer, which separates the vertically spaced metallization layers. The opening is typically formed using conventional lithographic and etching techniques. After an opening is formed, the opening is filled with copper or copper alloys to form a metal line and/or a via. Excess metal material on the surface of the dielectric interlayer is then removed by chemical mechanical polish (CMP). Although copper has low resistivity and high reliability, copper still suffers from electro-migration (EM) and stress-migration (SM) reliability issues as geometries continue to shrink and current densities increase. Various approaches are thus explored to solve these problems.

FIG. 1 is a cross-sectional view of an interconnect structure 15, in accordance with some embodiments. Two copper lines 2 and 4 with a diffusion barrier layer 6 are formed in a low-k dielectric layer 14 adjacent to each other and are insulated from each other by low-k dielectric layer 14. Metal caps 10 and 12, which are formed of materials having fewer electro-migration issues in comparison with copper, are formed on copper lines 2 and 4, respectively. Metal caps 10 and 12 may be formed by electroless plating or selective chemical vapor deposition (CVD), in accordance with some embodiments. The formation of metal caps greatly improves the reliability of the integrated circuit by reducing the surface migration of the copper lines. It has been found that under stressed conditions, the mean time to failure (MTTF) of the illustrated interconnection structure is about ten times longer than that of an interconnect structure having no metal caps. Part of the reason for the improvement is the reduction of electro-migration. With the metal caps, stress-induced void formation is also significantly reduced. Such improvement is especially important for interconnect structures with fine feature sizes and high current flow because the stress is higher for such structures.

However, the introduction of metal caps can potentially generate other problems. Metal caps are typically formed on copper lines, thus increasing the height of the conductive materials. For example, the formation of metal caps 10 and 12 increases the height of the conductive materials from H' to H. The parasitic capacitance between copper lines 2 and 4 (as well as the conductive materials surrounding copper lines 2 and 4) forms a parasitic capacitor, and the capacitance is proportional to the cross-sectional area of lines 2 and 4. Therefore, the formation of metal caps causes the parasitic capacitance to be H/H' times the capacitance with no metal caps formed. As a result, resistive-capacitive (RC) delay of the integrated circuit is increased.

An additional effect caused by the formation of metal caps 10 and 12 by electroless plating or selective CVD is an increase in leakage current. As shown in FIG. 1, portions of metal caps 10 and 12 extend from copper lines 2 and 4 over and beyond top edges of diffusion barrier layer 6, in some embodiments. The extended portions $E_1$ and $E_2$ increase the leakage current between metal caps 10 and 12. As is known in the art, leakage currents and parasitic capacitance are more significant when the copper lines are close to each other. Such issues become more pronounced for advanced technologies with finer feature sizes and smaller pitches.

Further, during the formation of the metal caps 10 and 12, metal residues, such as residues $R_1$, may remain on the surface of low-k dielectric layer 14 and cause shorting and/or leakage. FIG. 1 also shows that an etch stop layer 16 may be deposited between the low-k dielectric layer 14 and an upper dielectric layer 18, in accordance with some embodiments. The protruding metal caps 10 and 12 would affect the film profile of the etch stop layer 16 and cause topographical issues, which could affect patterning of upper layers. In order to reduce parasitic capacitance, leakage current, shorting between neighboring conductive features, topographical effect, and to improve EM and SM performance, new mechanisms of forming interconnection structures are needed.

Figure 2A:
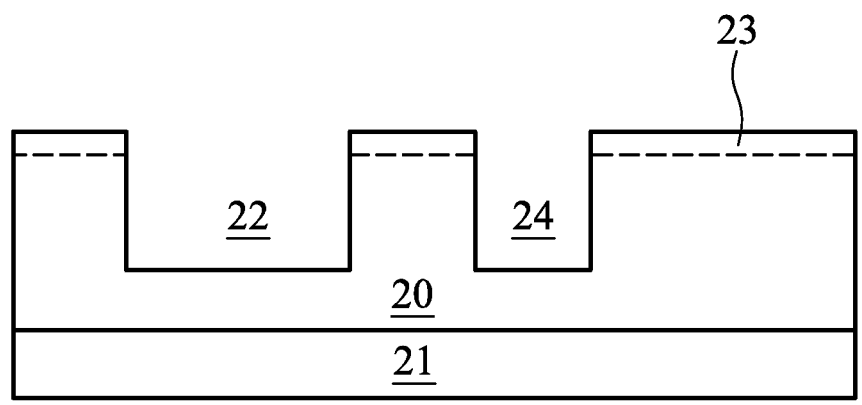
FIGS. 2A through 2K are cross-sectional views of intermediate stages in the making of interconnect structures, in accordance with some embodiments.

FIGS. 2A through 2K are cross-sectional views of intermediate stages in the making of interconnect structures, in accordance with some embodiments. FIG. 2A illustrates the formation of trenches 22 and 24 in a dielectric layer 20, which is an inter-metal dielectric (IMD) layer. The dielectric layer 20 is on a substrate 21, which may have active devices, such as transistors, etc., passive devices, such as resistors and others, interconnect structures, and insulating layers. In some embodiments, a hard mask (or etch stop) layer 23 is formed on dielectric layer 20 to assist the formation of trenches 22 and 24. The hard mask layer 23 may be made of SiN, SiON, or a combination thereof. The hard mask layer 23 may also be a metal hard mask.

In some embodiments, dielectric layer 20 is a low dielectric constant (low-k) dielectric material and has a dielectric constant (k value) lower than about 3.5. In some embodiment, the k value of dielectric layer 20 is equal to or lower than about 2.5. Suitable materials for the low-k dielectric material may include, but are not limited to, doped silicon dioxide, fluorinated silica glass (FSG), carbon-doped silicon dioxide, porous silicon dioxide, porous carbon-doped silicon dioxide, SiLK™ (an organic polymeric dielectric distributed by Dow Chemical of Michigan), Black Diamond (a product of Applied Materials of Santa Clara, Calif.), Xerogel, Aerogel, amorphous fluorinated carbon, Parylene, bis-benxocyclocutenes (BCB), polyimide, polynoroboneses, benzocyclocutene, PTFE, porous SiLK, hydrogen silsesquioxane (HSQ), methylsilsesquioxane (MSQ), and/or combinations thereof. The low-k dielectric material may be deposited by a chemical vapor deposition (CVD), plasma enhanced CVD (PECVD), or spin-on process.

The low-k dielectric could also be an extreme low-k dielectric (ELK). The ELK material may have a dielectric constant of less than about 2.5. Exemplary ELK materials include porous low-k materials. In some embodiments, the ELK is a silicon oxide based low-k material having a porous structure, which is adapted to a porogen-doped SiCO-based material by incorporating a porogen (or a porogen material) into a carbon-doped oxide dielectric. Other materials may also be used.

Figure 2B:
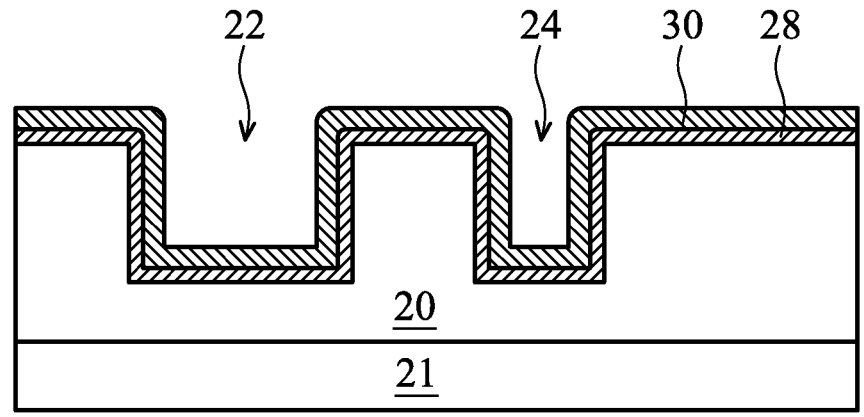

FIG. 2B illustrates a blanket formation of a diffusion barrier layer 28, which covers the sidewalls and bottoms of trenches 22 and 24. Diffusion barrier layer 28 may be formed of a material comprising titanium, titanium nitride, tantalum, tantalum nitride, ruthenium, ruthenium nitride, titanium compound, tantalum compound, cobalt, cobalt compound, manganese, manganese compounds, and combinations thereof. The formation methods may include physical vapor deposition (PVD), atomic layer deposition (ALD), chemical vapor deposition (CVD), and other commonly used methods.

Figure 2C:
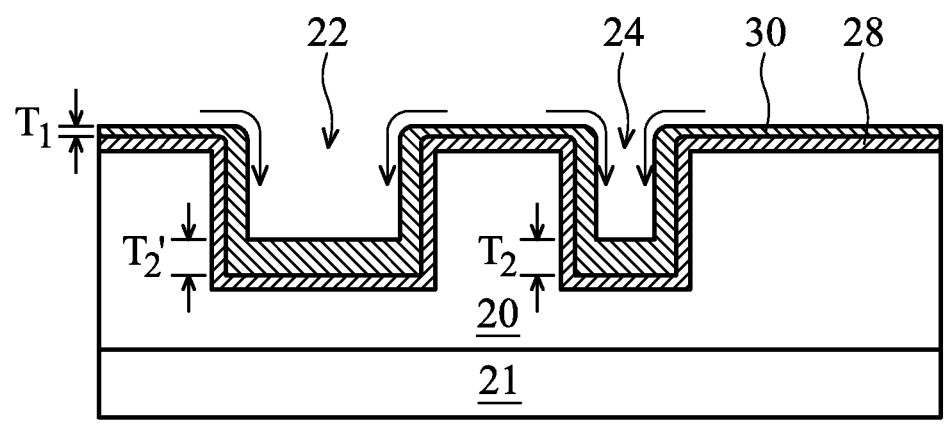

FIG. 2B also shows a conductive layer 30 being formed on diffusion barrier layer 28. Conductive layer 30 may include copper or copper alloys, although other materials such as aluminum, tungsten, silver, and combinations thereof, can also be used. The conductive layer 30 may be formed by various applicable methods, such as physical vapor deposition (PVD), chemical vapor deposition (CVD), atomic layer deposition (ALD), etc. In some embodiments, after conductive layer 30 is deposited, substrate 21 is heated to allow conductive layer 30 on a top surface substrate 21 to flow into the remaining trenches 22 and 24, as shown in FIG. 2C. During the reflow process, the thickness $T_1$ of conductive layer 30 on the top surface 23 is reduced and the thicknesses $T_2$ and $T_2'$ of conductive layer 30 in the recess regions are increased due to the addition of the reflowed conductive layer 30. Due to narrower width of trench 24 than trench 22, thickness $T_2$ is higher than thickness $T_2'$. Increasing the substrate temperature increase the surface mobility of the conductive layer 30. In some embodiments, the temperature of the substrate is raised to be in a range from about 150° C. to about 450° C. to assist reflow of the conductive layer 30. In some other embodiments, the substrate temperature is maintained at a reflow temperature during the deposition of the conductive layer. Under such circumstance, the deposition and reflow of the conductive layer 30 are performed simultaneously.

Figure 2D:
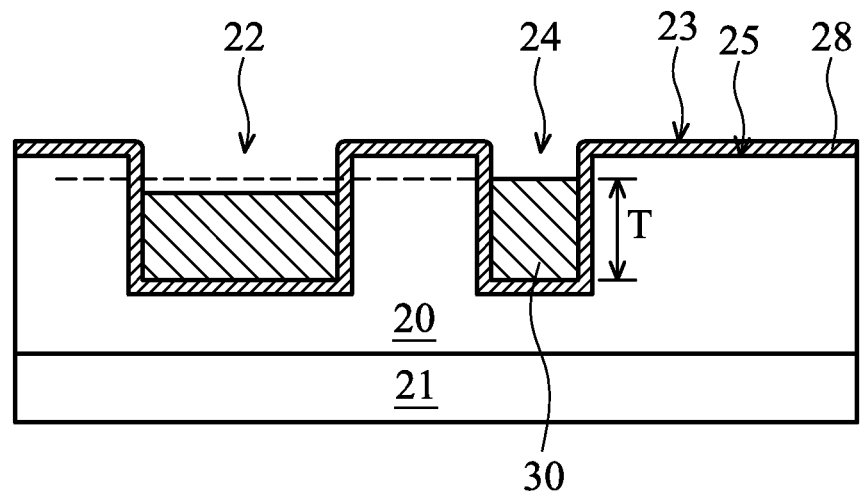
Figure 2E:
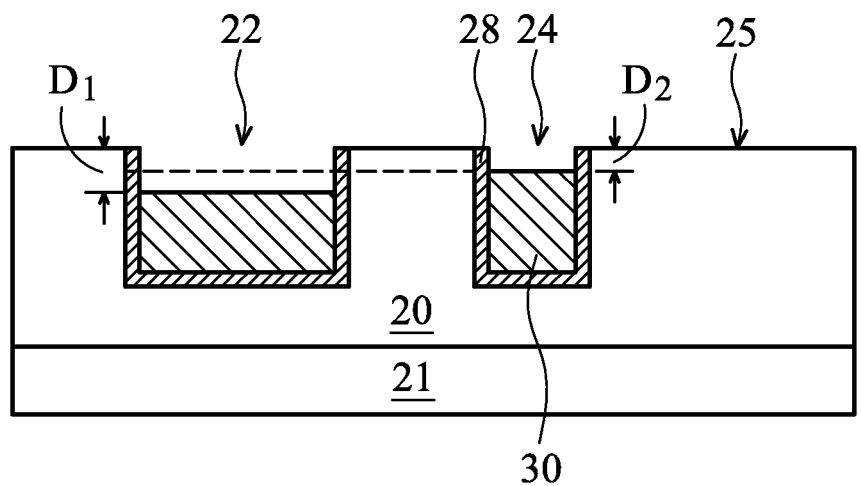

The deposition and reflow of the conductive layer 30 are repeated multiple times, if they are performed separately, until a target thickness T of the conductive layer is reached, as shown in FIG. 2D, in accordance with some embodiments. However, if the deposition and reflow of the conductive layer 30 are performed simultaneously, the process is performed until the target thickness T is reached in the narrow trench 24. In some embodiments, the width of the narrow trench 24 is in a range from about 10 nm to about 100 nm. In some embodiments, the thickness T in the narrow trench 24 is in a range from about 10 nm to about 100 nm. After the targeted thickness T is reached, the diffusion barrier layer 28 on the top surface 25 of substrate 21 is removed. For example, a dry etching may be used. Prior to etching the diffusion barrier layer 28, substrate 21 could be patterned with a photoresist to expose the regions the diffusion barrier layer 28 need to be removed and to cover the remaining surfaces. FIG. 2E shows substrate 21 after the diffusion barrier layer 28 on surface 25 is removed, in accordance with some embodiments. In some embodiments, there is residual conductive layer 30 on surface 23 of diffusion barrier layer 28. The residual conductive layer 30 is removed prior to diffusion barrier layer 28 on surface 25 being removed. An etch process for etching the material of the conductive layer 30 may be used. The etch process may be dry or wet. In some other embodiments, the removal process is not needed. In some embodiments, a recess $D_1$ in the wide trench structure 22 is in a range from about 0 nm to about 60 nm. In some embodiments, $D_2$ (recess in the narrow trench structure 24) is less than $D_1$, or $D_2 < D_1$.

Figure 2F:
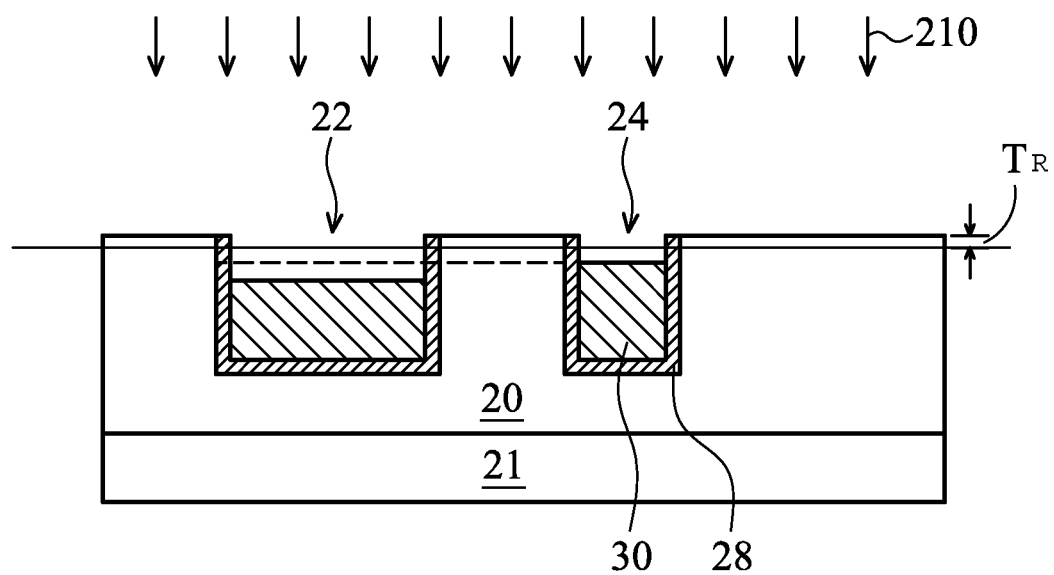

After the barrier layer 28 on surface 25 is removed, a removal process 210 is used to remove a portion of dielectric layer 20, as shown in FIG. 2F in accordance with some embodiments. The removal process 210 may be a chemical-mechanical polishing (CMP) process or an etching process. The thickness removed ($t_{TR}$) is in a range from about 10 nm to about 60 nm, in some embodiments. The thickness removed ($t_{TR}$) may also be larger than 60 nm. In some embodiments, the dielectric layer 20 is removed until the dielectric layer 20 is leveled with the conductive layer 30 in the narrow trench 24. In some other embodiments, the dielectric layer 20 is removed until the dielectric layer 20 is leveled with the conductive layer 30 in the wide trench 22.

Figure 2G:
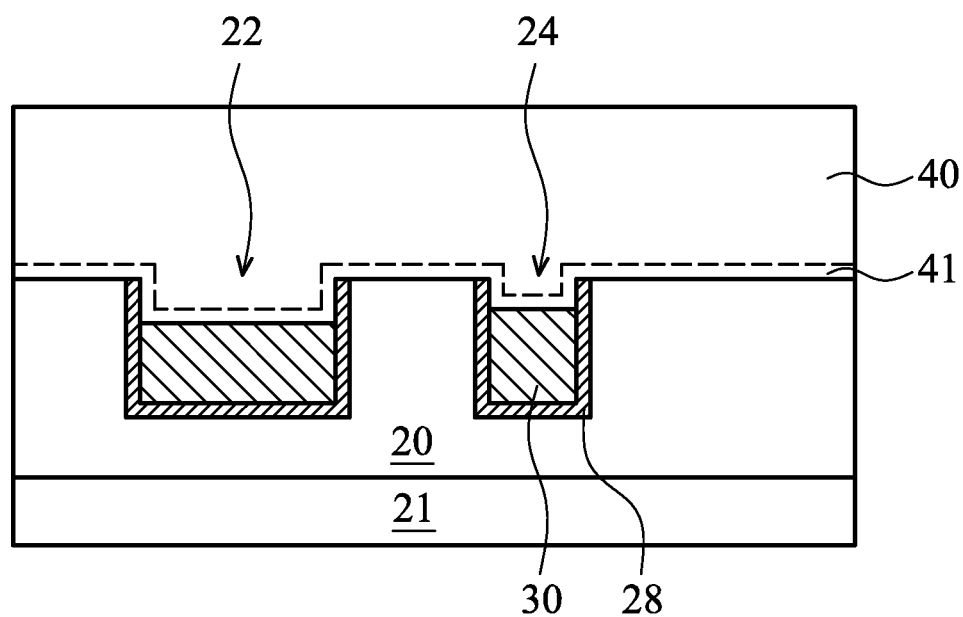

Afterwards, a dielectric layer 40 may be deposited over the structures in FIG. 2E or structures in FIG. 2F after removing a portion of the dielectric layer 20, in some embodiments. The dielectric layer 40 is deposited to form next level of interconnect. Materials suitable to form dielectric layer 20 may also be used for dielectric layer 40. In some embodiment, an etch stop layer 41 is formed between the dielectric layer 40 and dielectric layer 20, as shown in FIG. 2G in accordance with some embodiments. Etch stop layer 41 is similar to the etch stop layer 16 described above. For example, the etch stop layer may be made of SiC. In some embodiments, the thickness of the etch stop layer 41 is in a range from about 5 nm to about 50 nm. Additional processing operations may be performed to form additional interconnect structures.

In some embodiments, after the deposition and reflow of the conductive layer 30 are performed to reach the targeted thickness T, as described in FIG. 2D above, a metal cap layer 50 may be deposited on substrate 21. The metal cap layer 50 is conductive and may include material(s) such as cobalt, nickel, tungsten, molybdenum, silicon, zinc, chrome, ruthenium, manganese, boron, phosphorus, nitrogen, and combinations thereof. The metal cap layer 50 may be a composite layer comprising more than one layer. A metal cap layer 50 has low resistivity and is a good diffusion barrier for copper. Also, the metal cap layer 50 should not form (or does not easily form) a complex or a compound with copper. Metal cap layer 50 has low reactivity with copper. Any materials having such characteristics may be used to form the metal cap layer 50. In some embodiments, the thickness of the metal cap layer 50 is in a range from about 0.5 nm to about 20 nm. The metal cap layer 50 may be deposited by PVD, CVD, ALD, or other applicable methods or processes.

Figure 2H:
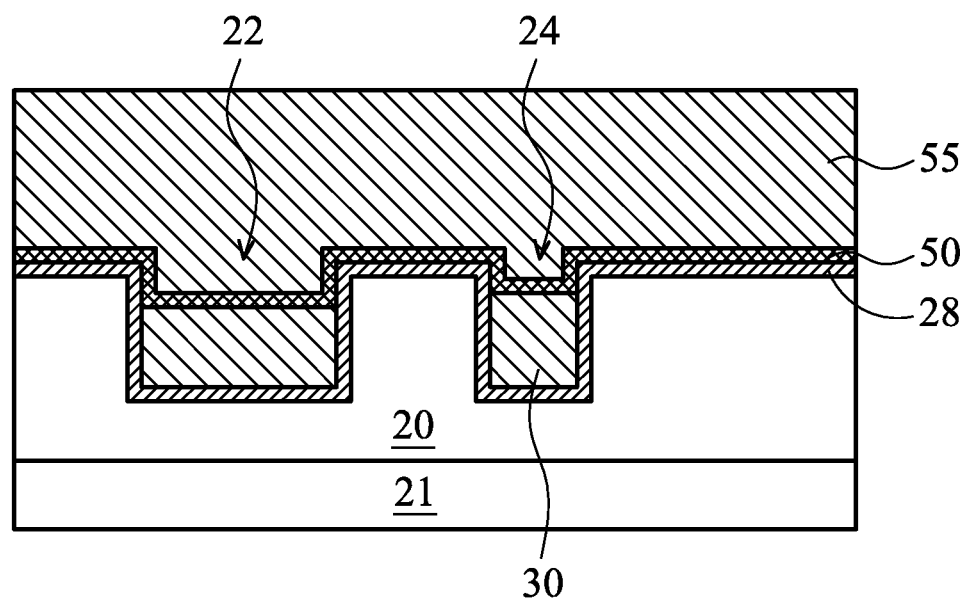
Figure 2I:
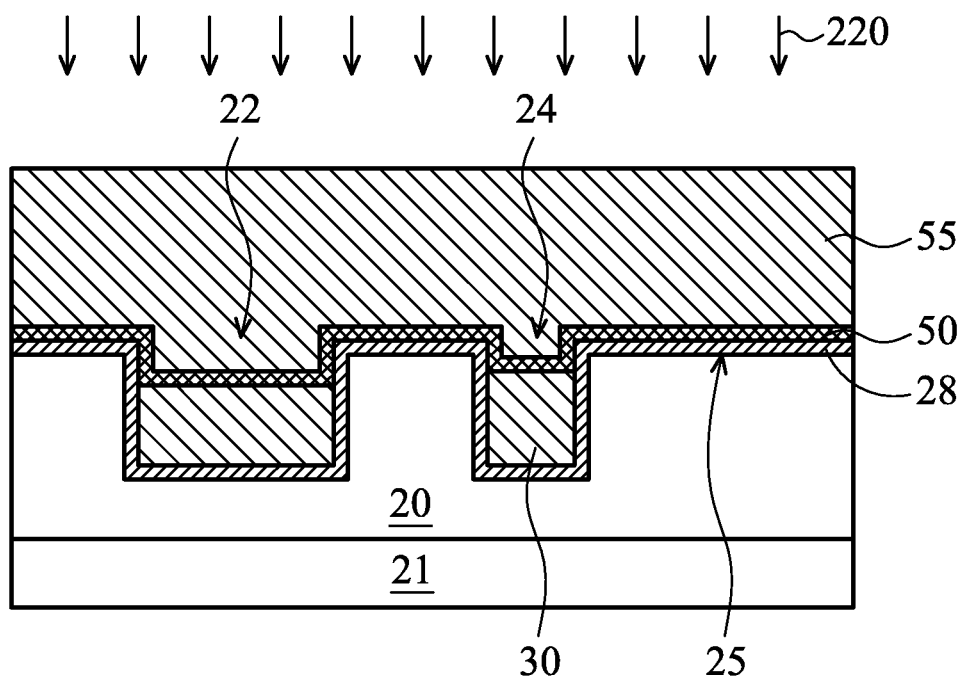

After the metal cap layer 50 is deposited, a second conductive layer 55 is deposited, as shown in FIG. 2I in accordance with some embodiments. The second conductive layer 55 may be made of copper or copper alloys, although other materials such as aluminum, tungsten, silver, and combinations thereof, can also be used. The second conductive layer 55 may be formed by various applicable methods, such as physical vapor deposition (PVD), chemical vapor deposition (CVD), atomic layer deposition (ALD), electro-chemical plating, etc. In some embodiments, the second conductive layer may be deposited by the same method as the first conductive layer 30. In some embodiments, the thickness of the second conductive layer 55 is in a range from about 50 nm to about 1000 nm (measured on a field surface). FIG. 2H illustrates the metal cap layer 50 covering the substrate surface and the recess regions in trenches 22 and 24 and also the second conductive layer 55 over the metal cap layer 50, in accordance with some embodiments.

Figure 2J:
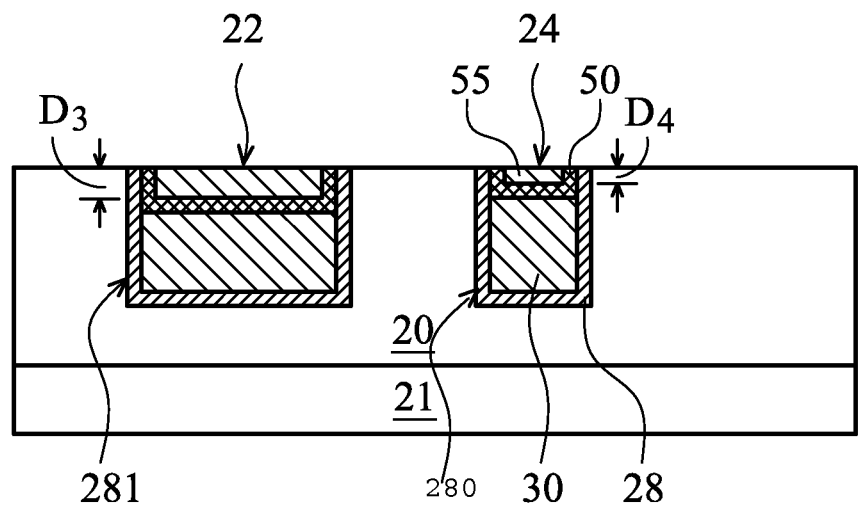
Figure 2K:
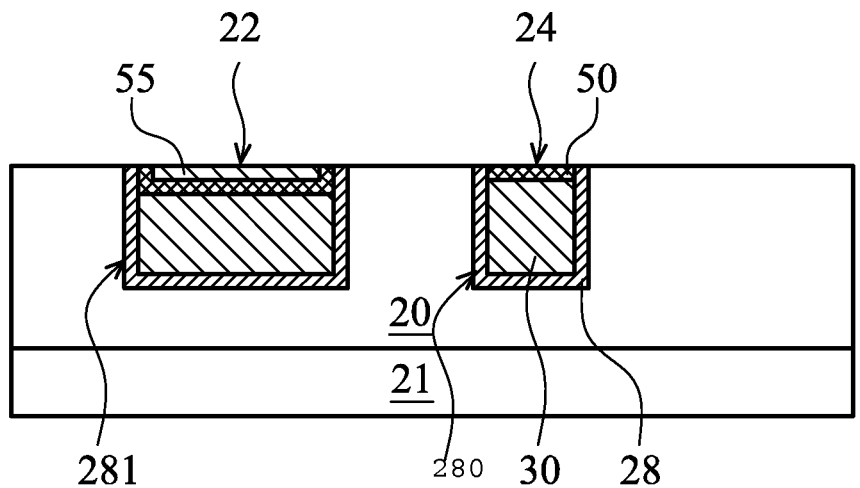

Afterwards, a removal process 220 may be performed to remove excess conductive layer 55, the metal layer 50, and diffusion barrier layer 28 on substrate surface 25, in some embodiments. The removal process 220 may be a CMP process or an etching process. In some embodiments, more than one removal processes are needed to remove the different layers on substrate surface 25. In some embodiments, the removal process also removes a portion of dielectric layer 20. FIGS. 2J and 2K show a cross-sectional view of substrate 21 after the removal process(es) is completed, in some embodiments. FIG. 2J shows that the removal process 220 leaves the second copper layer 55 in both trenches 22 and 24. In contrast, FIG. 2K shows that the etching process 220 remove the second copper layer 55 completely from the narrow trench 24 and leave a portion in trench 22. In some embodiment, the recess $D_3$ in the wide trench structure 22 is in a range from about 1 nm to about 50 nm. In some embodiment, the recess $D_4$ in the narrow trench structure 24 is less than $D_3$, or $D_4 < D_3$.

The selection of using which interconnect structures in FIG. 2F (without metal cap), FIG. 2J, or FIG. 2K depends on the application. For applications with relatively low current, where leakage is not a significant issue, interconnect structures in FIG. 2F may be used. For applications with higher current and having leakage issue, structures in FIGS. 2J and 2K may be used. The metal cap layers in the metal interconnect helps reduce copper diffusion. The wider interconnect structure 281 in FIGS. 2J and 2K have a second conductive layer 55 not covered by the metal cap layer 50. For wider interconnect structures, the current density is lower than the narrower structures, such as structure 280. As a result, the risk of leakage and/or electro-migration (EM) is very small or none. Therefore, a portion of the second conductive layer 55 not covered by the metal cap layer 50 does not cause leakage for wide structures. Leaving a second conductive layer 55 on the narrower structure 280 is acceptable for some applications. Further, leaving the second conductive layer 55 over the metal cap layer 50 allows process and/or electrical tunings.

Figure 3:
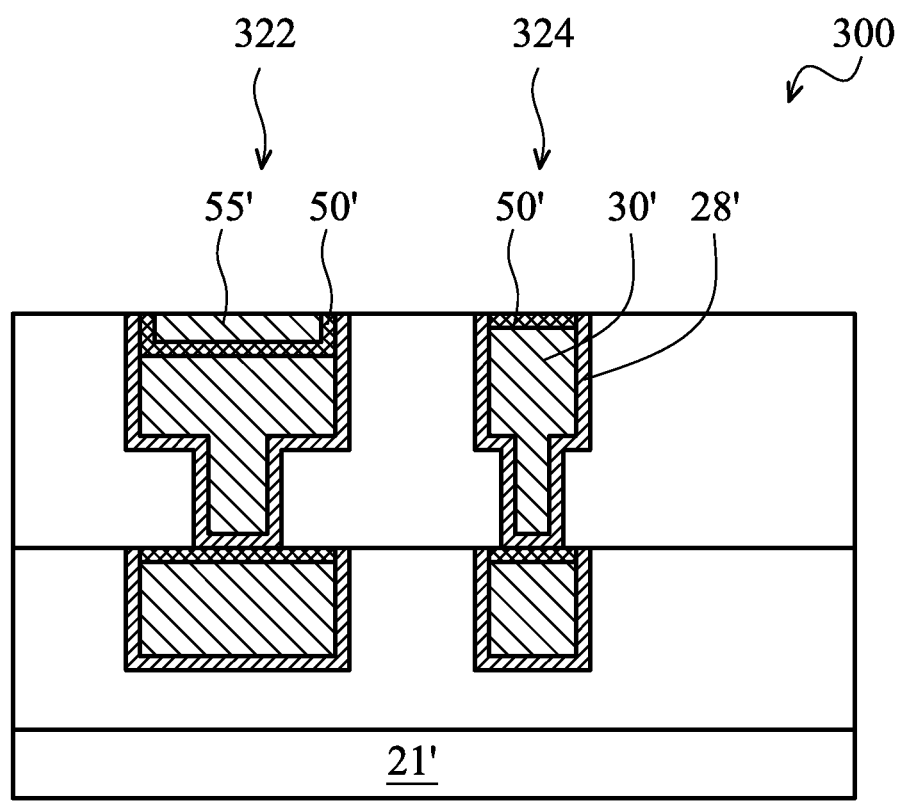
FIG. 3 is a cross-sectional view of an interconnect structure with dual damascene structures, in accordance with some embodiments.

In the embodiments provided in the preceding paragraphs, single damascene structures and processes are used to explain the mechanisms for forming the structures. One skilled in the art will realized that the teaching is readily available for forming a contact and/or via structure and dual damascene structures. The structures described in FIGS. 1, 2A-2K are trenches. However, they also can be contacts or vias. In some embodiments, the widths of the contacts or vias are in a range from about 5 nm to about 100 nm. FIG. 3 illustrates an interconnect structure 300 comprising dual damascene structures, in accordance with some embodiments. Similarly, in the embodiment shown in FIG. 3, metal cap 50' is formed on via-metal structures 322 and 324. The wide structure 322 has a second conductive layer 55', which is similar to the second conductive layer 55.

The mechanisms of forming an interconnect structures described above involves using a reflowed conductive layer. The reflowed conductive layer is thicker in smaller openings than in wider openings. The mechanisms may further involve forming a metal cap layer over the reflow conductive layer, in some embodiments. The interconnect structures formed by the mechanisms described have better electrical and reliability performance. For example, the parasitic capacitance, leakage current, shorting between neighboring conductive features and/or topographical effect can be reduced. In addition, the EM and SM performances can be improved.

In some embodiments, an interconnect structure is provided. The interconnect structure includes a first trench, and a second trench. The second trench is wider than the first trench, and both trenches are lined with a diffusion barrier layer. A first conductive layer is deposited over the diffusion barrier layer, and a metal cap layer is deposited over the first conductive layer. A second conductive layer is deposited over the metal cap layer in the second trench.

In some other embodiments, an interconnect structure is provided. The interconnect structure includes a first trench, and a second trench. The second trench is wider than the first trench, and both trenches are lined with a diffusion barrier layer. A conductive layer is deposited over the diffusion barrier layer, and the conductive layer is thicker in the first trench than the second trench.

In yet some other embodiments, a method of forming an interconnect structure is provided. The method includes forming a first opening and a second opening in a dielectric layer on a substrate, and the first opening is narrower than second opening. The method also includes depositing a diffusion barrier layer to line the first opening and the second opening. The method further includes forming a reflow metal layer to fill at least portions of the first and the second openings after the diffusion barrier layer has lined the first opening and the second opening. The reflow metal layer is thicker in the first opening than in the second opening.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An interconnect structure, comprising:
   a first trench; and
   a second trench, wherein the second trench is wider than the first trench, and wherein both trenches are lined with a diffusion barrier layer having a substantially uniform thickness, and wherein a first conductive layer is deposited over the diffusion barrier layer, and wherein a metal cap layer is over the first conductive layer, and wherein a second conductive layer is deposited over the metal cap layer in the second trench, and the diffusion barrier layer is between the second conductive layer and a sidewall of the second trench, and the metal cap layer inside the second trench is in direct contact with the diffusion barrier layer,
   wherein a first maximum thickness of the first conductive layer in the second trench is less than a second maximum thickness of the first conductive layer in the first trench.

2. The interconnect structure of claim 1, wherein the second conductive layer is over the metal cap layer in the first trench.

3. The interconnect structure of claim 1, wherein the first conductive layer is thicker in the first trench than the second trench.

4. The interconnect structure of claim 1, wherein the first conductive layer and the second conductive layer both comprise copper.

5. The interconnect structure of claim 1, wherein the metal cap layer comprises at least one of cobalt, nickel, tungsten, molybdenum, silicon, zinc, chrome, boron, phosphorus, nitrogen, or combinations thereof.

6. The interconnect structure of claim 1, wherein the metal cap layer has a thickness in a range from 0.5 nm to 20 nm.

7. The interconnect structure of claim 1, wherein the width of the first trench is in a range from 10 nm to 100 nm.

8. The interconnect structure of claim 1, wherein first and second trenches are part of at least one dual damascene structure.

9. The interconnect structure of claim 1, wherein a distance from a top surface of the second trench to the first conductive layer is in a range from 1 nm to 50 nm.

10. An interconnect structure, comprising:
    a first trench; and
    a second trench, wherein the second trench is wider than the first trench, and wherein both trenches are lined with a diffusion barrier layer having a substantially uniform thickness, and wherein a conductive layer is over the diffusion barrier layer, and a metal cap layer in both trenches is over an entirety of the conductive layer, and a second conductive layer is over the metal cap layer in the second trench, and the diffusion barrier layer is between the second conductive layer and a sidewall of the second trench,
    wherein a first maximum thickness of the first conductive layer in the second trench is different from a second maximum thickness of the first conductive layer in the first trench, and a bottom surface of the first conductive layer in the second trench is substantially co-planar with a bottom surface of the first conductive layer in the first trench.

11. An interconnect structure comprising:
    a substrate;
    a dielectric layer over the substrate, the dielectric layer having a first opening therein;
    a diffusion barrier layer lining the first opening, wherein a top surface of the diffusion barrier layer is planar with a top surface of the dielectric layer, and the diffusion barrier layer has a substantially uniform thickness;
    a first conductive layer in the first opening, wherein an entirety of the first conductive layer is below the top surface of the dielectric layer;
    a first process layer over the first conductive layer, wherein a top surface of a central portion of the first process layer is below the top surface of the dielectric layer; and
    a second conductive layer in the first opening, wherein the first process layer is between the second conductive layer in the first opening and the dielectric layer, wherein a maximum thickness of the second conductive layer in the first opening is greater than a maximum thickness of the second conductive layer in a neighboring trench.

12. The interconnect structure of claim 11, wherein the second conductive layer in the first opening is over the first process layer, wherein the first process layer is a metal cap layer.

13. The interconnect structure of claim 12, wherein a top surface of the second conductive layer in the first opening is planar with the top surface of the dielectric layer.

14. The interconnect structure of claim 11, further comprising:
    a second conductive layer in a second opening in the dielectric layer, wherein a top surface of the second conductive layer in the second opening is below the top surface of the dielectric layer; and
    a second process layer over the second conductive layer in the second opening.

15. The interconnect structure of claim 14, wherein a first distance between the top surface of the first conductive layer and the top surface of the dielectric layer is greater than a second distance between the top surface of the second conductive layer in the second opening and the top surface of the dielectric layer.

16. The interconnect structure of claim 14, wherein the second process layer is a metal cap layer and a top surface of the metal cap layer is planar with the top surface of the dielectric layer.

17. The interconnect structure of claim 14, wherein the second process layer is a metal cap layer.

18. The interconnect structure of claim 14, further comprising a third conductive layer over the second process layer, wherein the second process layer is a metal cap layer.

19. The interconnect structure of claim 18, wherein a top surface of the third conductive layer is planar with the top surface of the dielectric layer.

20. The interconnect structure of claim 11, wherein the diffusion barrier layer is between a sidewall of the first process layer and the dielectric layer.

* * * * *